(12) United States Patent
Frisson

(10) Patent No.: US 11,334,291 B2
(45) Date of Patent: May 17, 2022

(54) METHOD AND APPARATUS FOR ISOLATING A MEMORY

(71) Applicant: NXP B.V., Eindhoven (NL)

(72) Inventor: Jo Frisson, Hoegaarden (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/836,619

(22) Filed: Mar. 31, 2020

(65) Prior Publication Data

US 2021/0303207 A1  Sep. 30, 2021

(51) Int. Cl.
| | |
|---|---|
| G06F 3/06 | (2006.01) |
| G11C 7/22 | (2006.01) |
| G06F 13/28 | (2006.01) |
| G06F 1/10 | (2006.01) |
| G06F 13/16 | (2006.01) |

(52) U.S. Cl.
CPC .............. *G06F 3/0659* (2013.01); *G06F 1/10* (2013.01); *G06F 3/0604* (2013.01); *G06F 3/0673* (2013.01); *G06F 13/1668* (2013.01); *G06F 13/28* (2013.01); *G11C 7/22* (2013.01)

(58) Field of Classification Search
CPC ................................. G06F 13/00; G06F 12/00
USPC ......................................................... 711/154
See application file for complete search history.

(56) References Cited

U.S. PATENT DOCUMENTS

| | | | | |
|---|---|---|---|---|
| 6,204,695 B1* | 3/2001 | Alfke | ..................... | G06F 1/10 326/93 |
| 6,583,648 B1* | 6/2003 | Cai | ..................... | G06F 1/10 326/93 |
| 6,950,366 B1 | 9/2005 | Lapidus et al. | | |
| 9,842,068 B2 | 12/2017 | Wang | | |
| 2004/0153977 A1* | 8/2004 | Wilcox | .................... | G06F 30/30 716/103 |
| 2007/0156995 A1* | 7/2007 | Kaburlasos | ......... | G06F 13/4243 711/167 |
| 2008/0062810 A1* | 3/2008 | Hur | ...................... | G11C 7/1072 365/233.1 |
| 2009/0158076 A1* | 6/2009 | Chejara | .................... | G06F 1/04 713/500 |
| 2012/0011383 A1* | 1/2012 | Bhoj | ........................ | G06F 1/26 713/323 |
| 2013/0159757 A1* | 6/2013 | Park | ...................... | G06F 1/3275 713/400 |

FOREIGN PATENT DOCUMENTS

EP          1540923 B1     8/2011

\* cited by examiner

*Primary Examiner* — Titus Wong

(57) ABSTRACT

Embodiments of a method and device are disclosed. In an embodiment, a controller includes a plurality of memories each having registers that are accessible using an address, a plurality of memory controllers each coupled to a memory and configured to control read and write operations to the respective coupled memory, a bus coupled to each of the memory controllers configured to communicate data and commands to each of the memory controllers, a plurality of processing cores coupled to the bus and configured to read and write data to the memories through the memory controllers, and a plurality of isolation stages, each isolation stage being coupled between a memory controller and a memory and configured to isolate the respective memory from receiving a memory clock signal when the memory is not addressed by the memory controller.

19 Claims, 6 Drawing Sheets

METHOD AND APPARATUS FOR ISOLATING A MEMORY

BACKGROUND

A controller or processor may have multiple cores coupled to multiple memories using a bus, a mesh, or another type of interconnect structure. Each memory has a memory controller between the data registers of the memory and the interconnect structure. In some cases, each memory has a data port (D), an address port (A), a write enable port (WE or WEB) and a chip select port (CS). When a core is accessing a memory then these ports are active to respond to the read or write requests. When the memory is not being accessed, then these ports are still active ready to immediately respond to any request.

SUMMARY

Embodiments of a method and device are disclosed. In an embodiment a controller is disclosed. In an embodiment, the controller includes a plurality of memories each having registers that are accessible using an address, a plurality of memory controllers each coupled to a memory and configured to control read and write operations to the respective coupled memory, a bus coupled to each of the memory controllers configured to communicate data and commands to each of the memory controllers, a plurality of processing cores coupled to the bus and configured to read and write data to the memories through the memory controllers, and a plurality of isolation stages, each isolation stage being coupled between a memory controller and a memory and configured to isolate the respective memory from receiving a memory clock signal when the memory is not addressed by the memory controller.

In an embodiment, the memory controller is configured to provide a select signal when the respective coupled memory is addressed and wherein the isolation stage passes the memory clock signal in response to detecting the select signal.

In an embodiment, the isolation stage comprises a gate between a memory clock source and a memory clock input of the memory, the gate having a toggle input coupled to the select signal from the memory controller.

In an embodiment, the gate comprises a flip-flop with a toggle input.

In an embodiment, the gate responds to the select signal to provide the clock signal to the memory with a delay, wherein the delay is less than one half clock cycle of the memory clock source.

In an embodiment, the memory is configured to respond to an address line upon receiving the delayed clock signal within a same clock cycle as the delayed clock signal.

In an embodiment, the controller includes a flip-flop between the memory controller select signal and the gate, the flip-flop having a select output and coupled to the clock source so that the select output only changes on each clock cycle of the clock signal.

In an embodiment, the isolation stage is further configured to isolate the memory from data, address, and write enable lines when the memory is not addressed by the memory controller.

In an embodiment, the memory controller is configured to provide a select signal when the respective coupled memory is addressed and wherein the isolation stage isolates the memory from the data, address, and write enable lines of the memory controller when no select signal is provided.

In an embodiment, the memory controller is configured to provide a write enable signal on the write enable line to write data on data lines to the memory and wherein the isolation stage is further configured to isolate the memory from the data lines when no write enable signal is provided.

In an embodiment, the memory controller is configured to provide a zero output on the data lines when there is no data present at the memory controller to write to the memory and wherein the isolation stage isolates the memory from the zero output.

In an embodiment, the controller includes a bypass structure between each memory controller and each respective memory configured to bypass the respective isolation stage in response to receiving a bypass signal.

In an embodiment, the bus has a mesh configuration.

In an embodiment, a method for operating a memory system includes receiving a memory clock at a gate from a memory clock source, wherein the gate is coupled between the memory clock source and a memory, receiving a select signal from a memory controller at a trigger of the gate, wherein the memory controller is coupled to the memory, and blocking the memory clock at the gate to isolate the memory from the memory clock source in response to an OFF state of the select signal;

In an embodiment, the memory controller generates a write enable and an address signal to the memory, the method further comprising receiving the select signal at a second gate and blocking the write enable and the address signal through the second gate in response to an OFF state of the select signal.

In an embodiment, the memory controller generates a data signal to the memory, the method further comprising receiving the select signal and the write enable signal at a third gate and blocking the data signal through the third gate in response to an OFF state of the select signal and of the write enable signal.

In an embodiment, the method includes receiving an external bypass signal and allowing the memory clock at the gate to connect to the memory.

In an embodiment, a controller includes a plurality of memories each having registers that are accessible using an address, a plurality of memory controllers each coupled to a memory and configured to control read and write operations to the respective coupled memory, a memory mesh coupled to each of the memory controllers and configured to communicate data and commands to each of the memory controllers, a plurality of processing cores coupled to the memory mesh and configured to read and write data to the memories through the memory controllers, and a plurality of memory clock gates, each coupled between a memory clock source and a memory clock input of a respective memory, each gate having a toggle input coupled to a select signal from the respective memory controller configured to alternately connect and disconnect the memory clock source from the memory clock input in response to the respective select signal.

In an embodiment, the controller includes a plurality of data gates coupled between a data output of each memory controller and a respective data input of a respective memory each data gate having a toggle coupled to the select signal and to a write enable output of the respective memory controller configured to alternately isolate and connect the respective memory controller data output and the memory data input.

In an embodiment, at least one processing core comprises a direct memory access module.

DETAILED DESCRIPTION

It will be readily understood that the components of the embodiments as generally described herein and illustrated in the appended drawing figures could be arranged and designed in a wide variety of different configurations. Thus, the following more detailed description of various embodiments, as represented in the Figs., is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
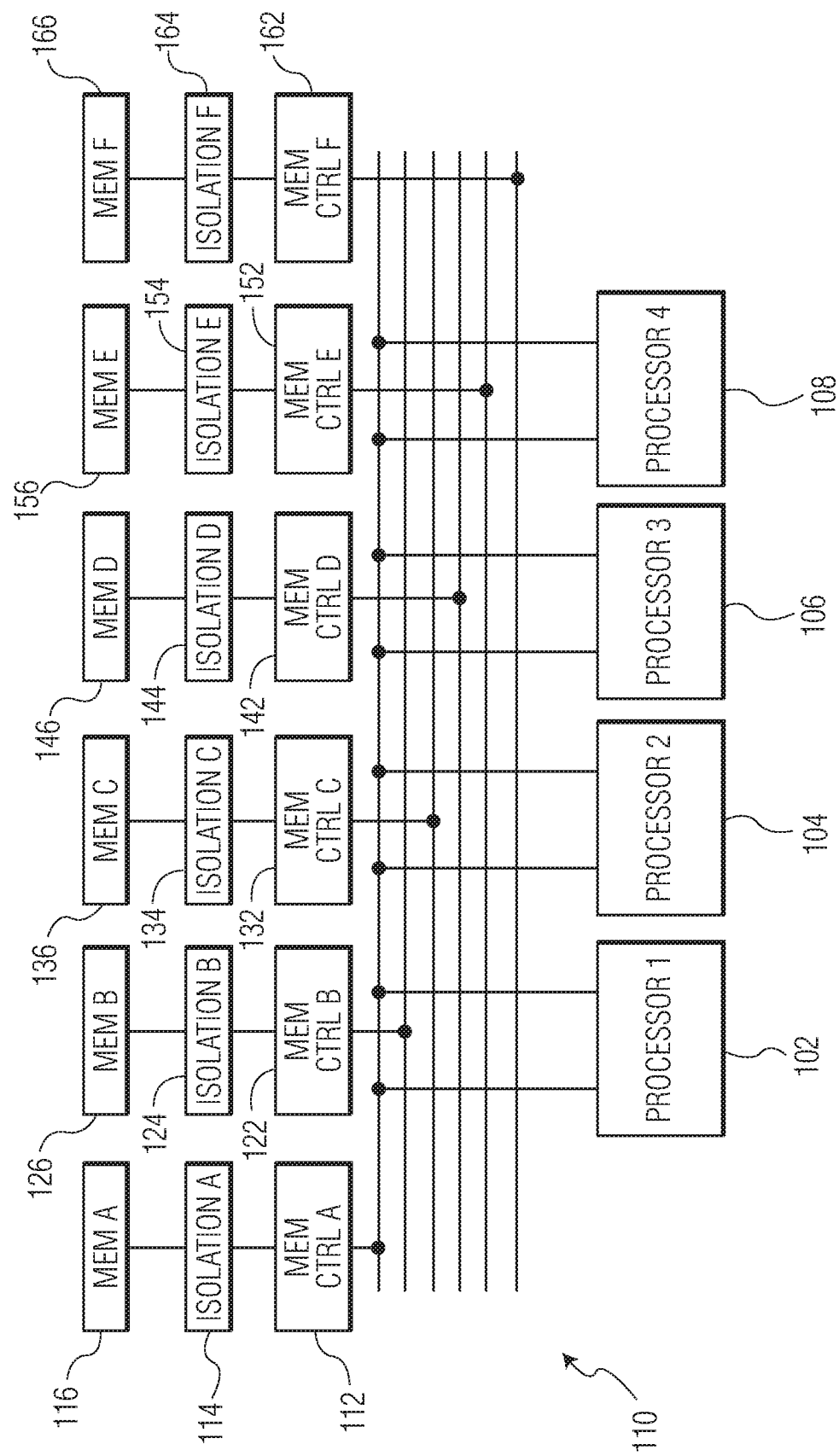
FIG. 1 depicts a portion of a controller that includes processors coupled to memories through a bus.

FIG. 1 depicts a portion of a controller that includes processors and memories. In this example there are four processors 102, 104, 106, 108. Each processor is coupled to the same memory bus 110. The bus is connected to multiple memory controllers 112, 122, 132, 142, 152, 162, each of which is coupled to a respective memory 116, 126, 136, 146, 156, 166. In some embodiments there may be fewer connections so that, for example, some of the processors may access only some or one of the memories while other processors may access all or a different group of memories. An isolation stage 114, 124, 134, 144, 154, 164 is connected between each memory processor and its respective memory. While four processors and six memories are shown, there may be more or fewer. This number is to illustrate that there is no particular or necessary correspondence between each processor and each memory. Each processor is connected to each memory through the bus and can access one or all of them. Each processor is shown as having two memory ports but more or fewer ports may be used. Depending on the cores just one or multiple memory ports can be present There are different ways to assign and distribute tasks and access between processors and memories and many of these can be applied to the illustrated configuration.

The memory bus is illustrated in the form of a crossbar but this is provided only as an example. A ring, mesh, fabric, or other interconnection between the processors and the memories may be used. In a mesh architecture, as indicated in FIG. 2, processing cores, on-chip cache banks, memory controllers, and I/O (Input/Output) controllers are organized in rows and columns, with wires and switches potentially connecting them at each intersection to allow any device to connect to any other.

The controller may be a central processing unit (CPU), digital signal processor (DSP), microcontroller, or any other digital system with multiple processors and multiple memories. The processors may be of different types with different tasks and different power profiles. Some of the processors may work together on a single combined task to improve the total throughput. The memories may be volatile or non-volatile and take any of a variety of different physical forms including SRAM (Static Random Access Memory), DRAM (Dynamic Random Access Memory), flash, magnetic, optical, or another. The memory controllers receive read and write data and commands communicated on the bus, map logical addresses to physical addresses, and perform maintenance operations. In the illustrated example, the total combined memory area is split into the six separate sections typically to reduce the power that would be consumed by one larger memory and to increase the speed at which any one memory can be accessed. In addition, with multiple memories, different registers may be read in parallel to speed data access.

Figure 2:
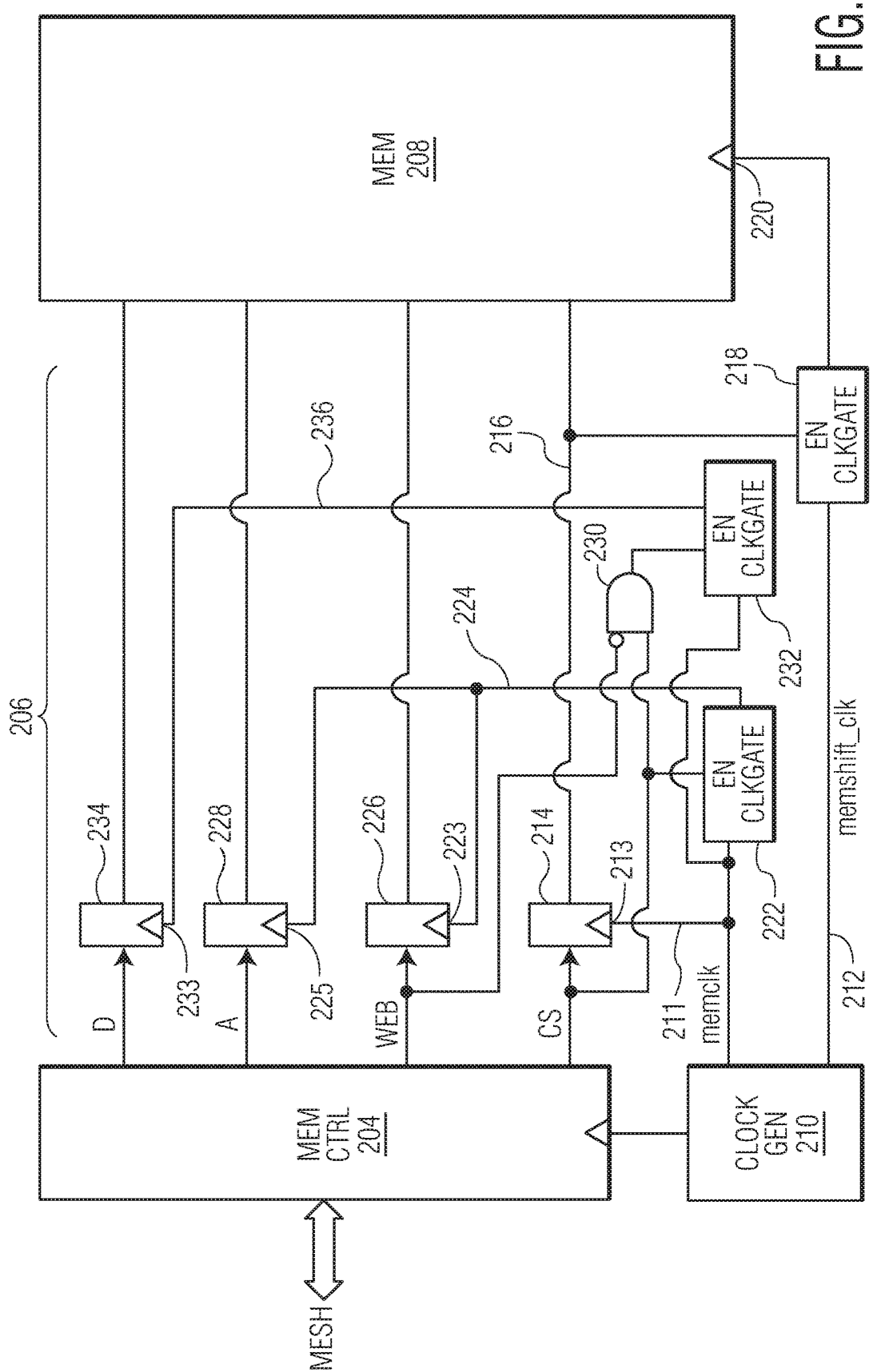
FIG. 2 depicts a memory controller coupled to an isolation stage through a memory.

FIG. 2 depicts a single memory controller 204 coupled through an isolation stage 206 to a memory 208. These structures may correspond to any one or more of the structures of FIG. 1 or to another structure. Opposite the isolation stage 206, the memory controller is coupled to the mesh which connects the memory controller to all of the processors and any other components on the mesh. While a mesh is shown, any other connection configuration may be used instead. In this example the memory controller has four ports: a data port (D) to transfer data that is to be written to the memory 208; an address port (A) to indicate a physical memory address that is to read from or written to the memory 208; a write enable bar port (WEB) that indicates a write command and which block of the memory is to be accessed; and a chip select port (CS) that is used to indicate whether the particular connected memory 208 is to be accessed or not. The memory controller 204 may have other connections to the memory and to other components but these are not indicated here in order to not obscure the invention. For each of these lines, D, A, WEB, CS, there is an output port from the memory controller and an input port to the memory. While these are referred to as inputs and outputs herein, some of the lines are bidirectional in that the memory also sends data to the memory controller on these or on other associated lines.

In some embodiments, the memory controller uses logical memory addresses to the memory. The memory translates the logical memory addresses to physical memory. In some embodiments, address translation is tracked and performed in the memory controller. Accordingly, the address line may be a logical address or a physical address, depending on the particular implementation. In some embodiments, the memory controller 204, isolation stage 206, and memory 208 form a single structure within a controller. In some embodiments, the memory controller is within the controller and the memory is external. In some embodiments, both the memory controller and the memory are external to the controller. Similarly, the isolation stage 206 may be a discrete structure as shown or integrated into the memory controller 204 or memory 208.

The memory 208 is timed by a clock generator 210 which is external to the memory 208. In some embodiments, the clock generator 210 is a part of the controller but may be driven by an external or internal precision reference clock. The clock generator 210 generates two clock signals 211, 212. The second clock signal 212 is delayed or phase-shifted with respect to the first clock signal by less than a single clock cycle. In some embodiments, the second clock signal is generated from the first clock signal by adding delay buffers between a line carrying the first clock signal and the second clock signal output. In some embodiments, the second clock signal is generated using clock gates. The clock gates are driven by a higher frequency common reference clock source. Other techniques may alternatively be used to generate the phase-shifted clock signal.

The second clock signal 212 is connected to a memory clock port 220 of the memory 208. The clock port 220 controls operation of the memory to determine when operations occur inside the memory. By using the second clock signal 212, the memory clock is delayed or phase-shifted with respect to the system clock enough to allow the isolation stage to operate.

In operation, with each new clock edge, each processor starts calculating new signaling to send to a respective memory. For a read operation, there is an address. For a write operation, there is the address, a write enable and the data that is to be written. This is sent through the mesh or bus and is received at the appropriate memory controller. The address determines which memory is accessed and each memory controller is able to determine whether the memory should be active based on the address. The memory controller can interpret the mesh or bus data and determine whether to activate the CS and WEB line to the memory.

In a zero-wait state system the address is first interpreted at the end of the clock cycle. All of the toggles reach all of the memory instances. This is shown in the timing diagram of FIG. 4. The memories let the input toggles on the address, data and control lines flow into the periphery structure of the memory so that memories that are not being addressed still consume power. Even cores that are not accessing any memory instance in a specific clock cycle make the memories consume power. As a result, memories not getting any active cycles can still consume some power.

The isolation stage 206 is configured between the memory and all of the inputs. It is able to isolate the memory from the D, A, WEB, and CS lines and even from the clock. Consider first the isolation that is configured between the clock generator 210 and the clock port 220 of memory 208. The clock signal 212 to the memory 208, which is the second time-shifted clock signal, is gated based on whether the respective memory is being addressed. As shown, a clock gate 218 of the isolation stage 206 is positioned between the time-shifted output clock signal 212 of the clock generator 210 and the clock port 220. The clock gate interrupts the second clock signal 212 to the memory clock port 220 unless the clock gate is enabled.

The clock gate enable input, also referred to as a toggle input, is coupled to the CS line from the memory controller. When the CS line 216 is low or OFF, the memory clock signal 212 is disabled at the clock gate 218 and no clock signal 212 reaches the memory 208 at the memory clock port 220. With no clock input, the circuits inside the memory that are controlled by the clock and the internal timing engine do not consume power. Other memory circuits may consume power due to toggling of the other inputs. When the CS line 216 is high or ON, indicating that there is a read or write action from the memory controller to the connected memory, then the clock gate is enabled by the CS line gate input and the memory is fully active to perform the read or write. This and the other clock gates may be implemented using any suitable digital logic circuit. In some embodiments, the clock gate is an enable gate. In some embodiments, the clock gate is a flip flop.

In the isolation stage 206, the CS line from the memory controller is first coupled to a gate or flip-flop 214 that blocks the CS line from reaching the memory. In some embodiments, a D flip-flop 214 has a D input directly from the CS line from the memory controller and a Q output direct to the memory 208. The flip-flop 214 has a clock input 213 coupled to the clock generator. The clock signal 211 to the clock input 213 is typically active at every clock cycle and the flip-flop 214 is set to the CS line state at the start of the clock cycle. The flip-flop state stays at the same state until the start of the next clock cycle. This stable CS output signal 216 is passed to the memory and only changes at each new clock pulse. When the CS line from the memory controller is low, then the memory input stays low. When the CS line from the memory controller is high, then the Q output 216 stays high until the Q output 216 changes state at the start of a new clock cycle. This eliminates the typical toggling and reduces the power consumption of the memory for some part of every clock cycle.

All of the D flip-flops 214, 226, 228, 234 of the isolation stage are clocked on the same clock that would otherwise be provided to the memory. When the state of the CS line is high at the start of a clock cycle, then the Q output 216 of the CS flip-flop 214 goes high. This is coupled not only to the memory 208 as the CS input but it is also coupled to the enable gate or toggle gate of the first clock gate 218. The high Q output opens the gate and allows the time-shifted clock signal 212 to connect to the memory 208. In normal operation, the CS line goes high immediately before the start of the memory clock cycle, such as on the rising edge. In this embodiment, the D flip-flop for the CS line at the D input causes the Q output to go high only after the start of a pulse the normal memory clock signal 211. By delaying or time-shifting the second clock signal 212 applied to the memory clock input, the isolation stage ensures that the CS input to the memory is already at the appropriate state before the clock pulse is received at the memory. As a result, the memory operates as it would without the isolation stage, except for the time-shifted delay.

In this description, gates, flip-flops, multiplexers, and other conventional structures are used as example implementations of the isolation stage. Many of these structures may be modified or replaced with other structures that perform similar functions, sometimes with minor changes in the connections shown herein. There are a variety of different gates, switches, and combiners that may be adapted and configured to operate as described herein.

As described above, the D flip-flop 214 for the CS line serves as an isolation register to isolate the memory controller 204 from the memory 208. The output CS value 216 at the CS memory input is allowed to change every clock cycle based on the first clock signal 211 clock input to the isolation register. By contrast, the isolation stage 206 also includes a D flip-flop 226 for the WEB line and a D flip-flop 228 for the A line from the memory controller. These each have a respective clock input 223, 225 that is only clocked when the CS line from the memory controller is high. If the CS line is low, meaning that the memory is not being accessed, then the WEB and A inputs at the memory are fixed and the memory power consumption is reduced. The isolation stage 206 also fixes the values to prevent any toggling.

In particular, the D flip-flop 226 for the WEB line has a D input connected to the WEB line from the memory controller 204 and a Q output connected to the memory 208. The D flip-flop 228 for the A line has a D input coupled to the A line from the memory controller and a Q output coupled to the A input to the memory. These flip-flops 226, 228 isolate the memory from these lines of the memory controller when there is no CS signal by using a gated clock input.

A second clock gate 222 is coupled to the first clock signal 211 that is also coupled to the CS line flip-flop. The output of this clock gate is coupled to the clock inputs 223, 225 of both the WEB flip-flop 226 and the A flip-flop 228. The enable input is coupled to the CS line directly out of the memory controller before the isolation register. When the CS line which is connected as an enable or toggle input, is high or ON, then the second clock gate 222 is enabled. This allows the clock signal to be coupled to the clock ports 213, 223 of the respective isolation stage flip-flops 226, 228 of the WEB and A lines so that the states of these flip-flops can change in response to the signal on those lines. In other words, the signals from the memory controller are connected to the memory WEB and A inputs. However, when the CS line is low or OFF, then the second clock gate 222 is disabled. The WEB and A flip-flops 226, 228 do not change state and the memory is isolated from any activity on these lines. In this way the memory 208 is isolated from these two lines, WEB, A, by the isolation stage 206. This reduces the power consumption of the memory when the memory is not being accessed as indicated by the CS line.

A fourth D flip-flop 234 has a D input connected to the D line of the memory controller 204 and a Q output connected to the memory 208. In some embodiments, the first clock signal 211 that is output by the second clock gate 222 is also coupled to the clock input 233 of the D flip-flop 234 for the D line. The first clock signal is passed when the CS line is active or ON but not when the memory is not being accessed. In this way the memory is also isolated from the D line whenever the CS line is low or OFF. This provides a further power savings just as there is for the WEB and A lines.

As noted above, the D line is only used for write operations and not for read operations. Accordingly, with the D line enabled by the CS line, the D line will be active on the memory 208 for write operations and also for read operations. This may cause portions of the memory that are connected to the D input to be active when there is no data to be written to the memory. In the illustrated embodiment, a third clock gate 232 is used to isolate the D line from the memory also during active read operations by using the WEB line.

The third clock gate receives the same first clock signal 211 from the clock generator 210 that is received at the second clock gate 222. The enable gate is connected to both the CS line and the WEB line through an AND gate 230. The WEB line is connected to the A input of the AND through an inverter. The CS line is directly connected to the B input of the AND gate 230. As a result, an enable signal is sent to the third clock gate 232 as an enable or toggle input only when the WEB line is high or ON indicating no write operation (but a read operation) and the CS line is low or OFF indicating that the memory is being addressed.

The third clock gate 232 has an output clock signal 236 coupled to the clock input 233 of the flip-flop 234 for the D line of the memory controller. In operation, the flip-flop 234 of the D line isolates the D line from the memory unless there is a write operation at the memory. Otherwise all of the connected circuitry in the memory is at a lower power mode.

Due to the two clock signals 211, 212 from the clock generator 210, the memory is clocked by the second phase-shifted clock signal 212 after the other clock gates and flip-flops have been set by the first clock signal 211. In this way, the memory sees active input when it receives the phase-shifted clocks. The memory 208 operates in the same way as without the isolation stage 206 due to the delayed second clock signal 212 and it still operates within the same clock cycle. Neither the operation or speed of memory access has changed. Accordingly, the timing requirements from the processors to the memory are also not changed.

The isolation stage significantly reduces power demands when the memory is not being accessed by isolating the data, write and address lines from the memory controller. In some embodiments, the processors also make their address or data outputs toward the memory busses zero during inactive memory cycles. The zero output is applied to the memory through the memory controller and also causes additional power consumption. The isolation stage also isolates the memory from these zero outputs by maintaining the last active state. This further prevents unnecessary memory power consumption.

Figure 3:
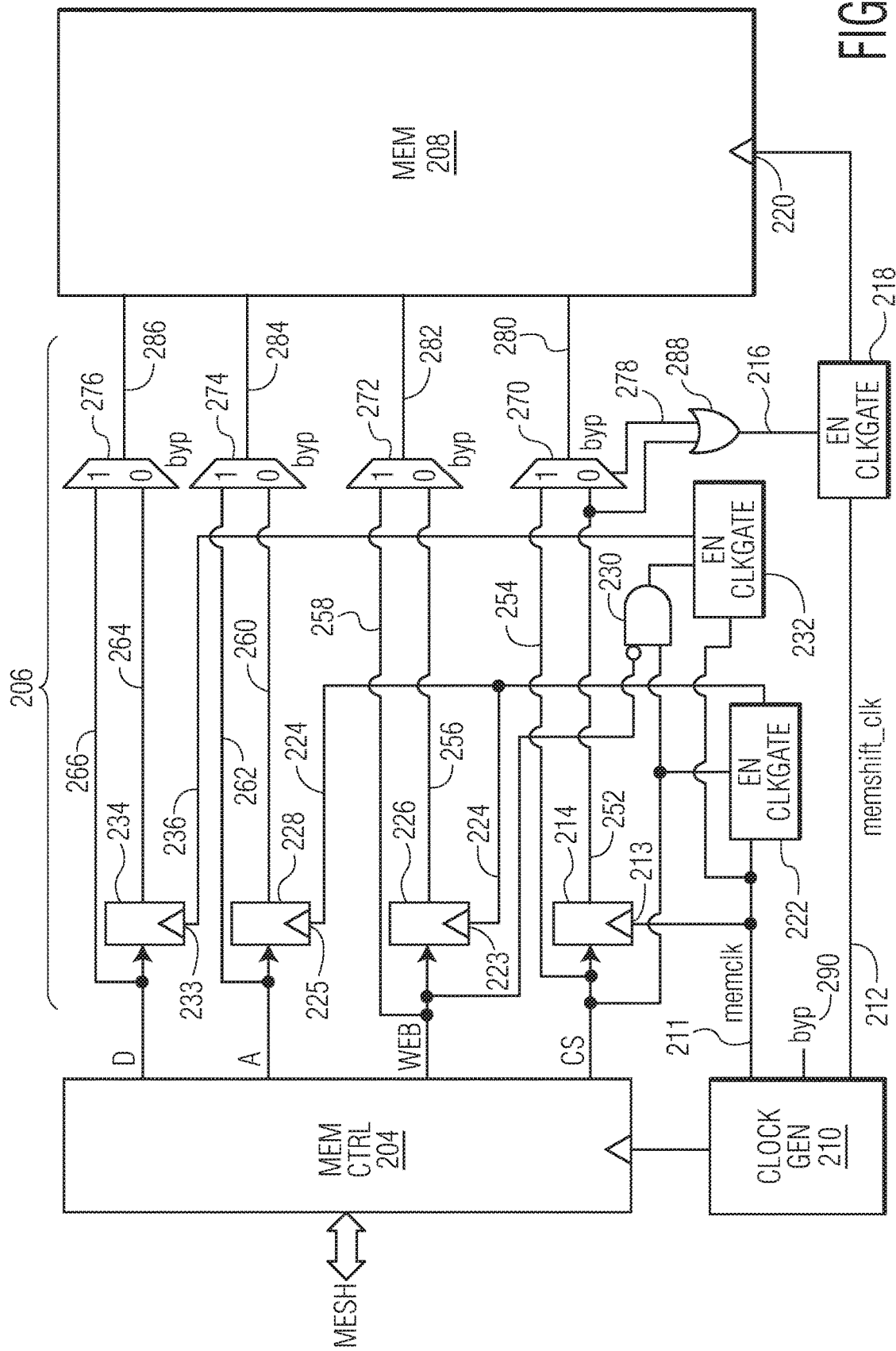
FIG. 3 depicts a memory controller coupled to an isolation stage with a bypass structure through a memory.

For a moderate clock rate, a partial clock cycle delay at the memory does not affect the timing of the system. However, in a high performance, high reliability, higher clock rate, or other special mode, the timing from the processor to the memory may be critical. FIG. 3 shows the configuration of FIG. 2 with bypass gates 270, 272, 274, 276 added to the isolation stage 206. The bypass gates allow the isolation gates to be bypassed in response to an external bypass control signal, labeled as byp.

In the example illustrated in FIG. 3, each line from the memory controller 204 has an added branch. The CS line has a first branch 252 that is connected through the isolation stage D flip-flop 214, as mentioned above, and a second branch 254 that bypasses the isolation stage of the D flip-flop 214. Instead of connecting directly to the memory 208, both the first branch 252 and the second branch 254 are inputs to the CS bypass gate 270 in the form of a two-input multiplexer. However, a variety of other structures may be used to achieve the same or a similar result. A third selector input, labeled as byp, is used to switch the multiplexer in and out of bypass mode.

In normal operation with the isolation stage active, the multiplexer selects the first branch 252 and blocks the second branch 254. The CS line is then active or isolated as explained above. When the selector input is reversed, then the multiplexer switches and the second branch 254 is passed to the memory 208 bypassing the isolation stage. The first branch 252 through the isolation stage is blocked. The CS line timing is determined only by the memory controller and there is no delay in the CS line reaching the memory 208.

Similarly, the WEB line has a first branch 256 that is connected through the isolation stage D flip-flop 226 and a second branch 258 that bypasses the isolation stage D flip-flop 226. Both the first branch 256 and the second branch 258 are inputs to the WEB bypass gate in the form of another multiplexer 272. With bypass disabled, the bypass gate passes the first branch 256 and blocks the second branch 258. When the bypass gate is switched at the selector input of the multiplexer, then the second branch 258 is passed to the memory 208 bypassing the isolation stage and the first branch 256. The memory is fully powered at all times and there is no delay in the WEB line reaching the memory 208.

In the same way, the address line (A) has a first branch 260 connected to the D flip-flop 228 of the isolation stage 206 and a second branch 262 that bypasses the entire isolation stage 206. The output of the A line flip-flop 228 does not connect directly to the memory 208 but first connects through the A line multiplexer 274. Both the first branch 260 and the second branch 262 are inputs to the A line multiplexer 274. In normal reduced power mode, the bypass gate passes the first branch 260 and blocks the second branch 262. This keeps the isolation stage active. In high performance or bypass mode, the external component changes the selector input and the second branch 262 is passed to the memory 208 bypassing the isolation stage.

The data (D) line also has a first branch 264 that is connected first to the isolation stage D flip-flop 234 and from there to the D line multiplexer 276. The D line has a second branch that bypasses the isolation stage D flip-flop 234 and is connected to the bypass bate 276. As with the other bypass gates, when the bypass mode at the selector input of the multiplexer is off, the bypass gate passes the first branch 264 and blocks the second branch 266. When the multiplexer 276 is activated by the external controller, then the operation is reversed so that the second branch 266 is passed to the memory 208 bypassing the isolation stage and the first branch 264 through the isolation stage is blocked. With all four lines from the memory controller active, the memory is fully powered at all times and there is no delay for memory access from the memory controller.

As mentioned above, the clock signal 212 from the clock generator 210 is blocked by a first clock gate 218 of the isolation stage 206 when the CS line is low or OFF. As mentioned above, the enable input of the first clock gate 218 between the shifted clock signal 212 and the input at the memory clock port 220 is the CS line. In FIG. 3, this first clock gate is also bypassed in a bypass mode so that the time-shifted clock signal 212 is always provided to the memory.

To complement the bypass gates an OR gate 288 is also added between the CS line and the enable input of the first clock gate 218. The A input to the OR gate 288 is the CS line so that the phase-shifted clock signal is provided through the clock gate 218 to the memory clock port 220 whenever the CS line is ON or high. This is the same operation as described with reference to FIG. 2. The B input to the OR gate is a bypass signal 278 from the CS line multiplexer 270. When the bypass signal is active or high to the selector input of the bypass multiplexer, it not only sets the multiplexer to bypass the CS line isolation register, it also sets the OR gate output to go high. This is coupled from the OR gate to the enable gate input 216 of the first clock gate 218. The first clock gate is accordingly bypassed and the memory receives every phase-shifted clock pulse. An additional bypass input 290 at the clock generator 210 disconnects the phase delay of the phase-shifted clock output so that both clock signals 211, 212 are the same. In some embodiments, the first clock signal 211 is passed to the memory in bypass mode. In either event, in bypass mode, the memory is fully powered at all times.

Figure 4:
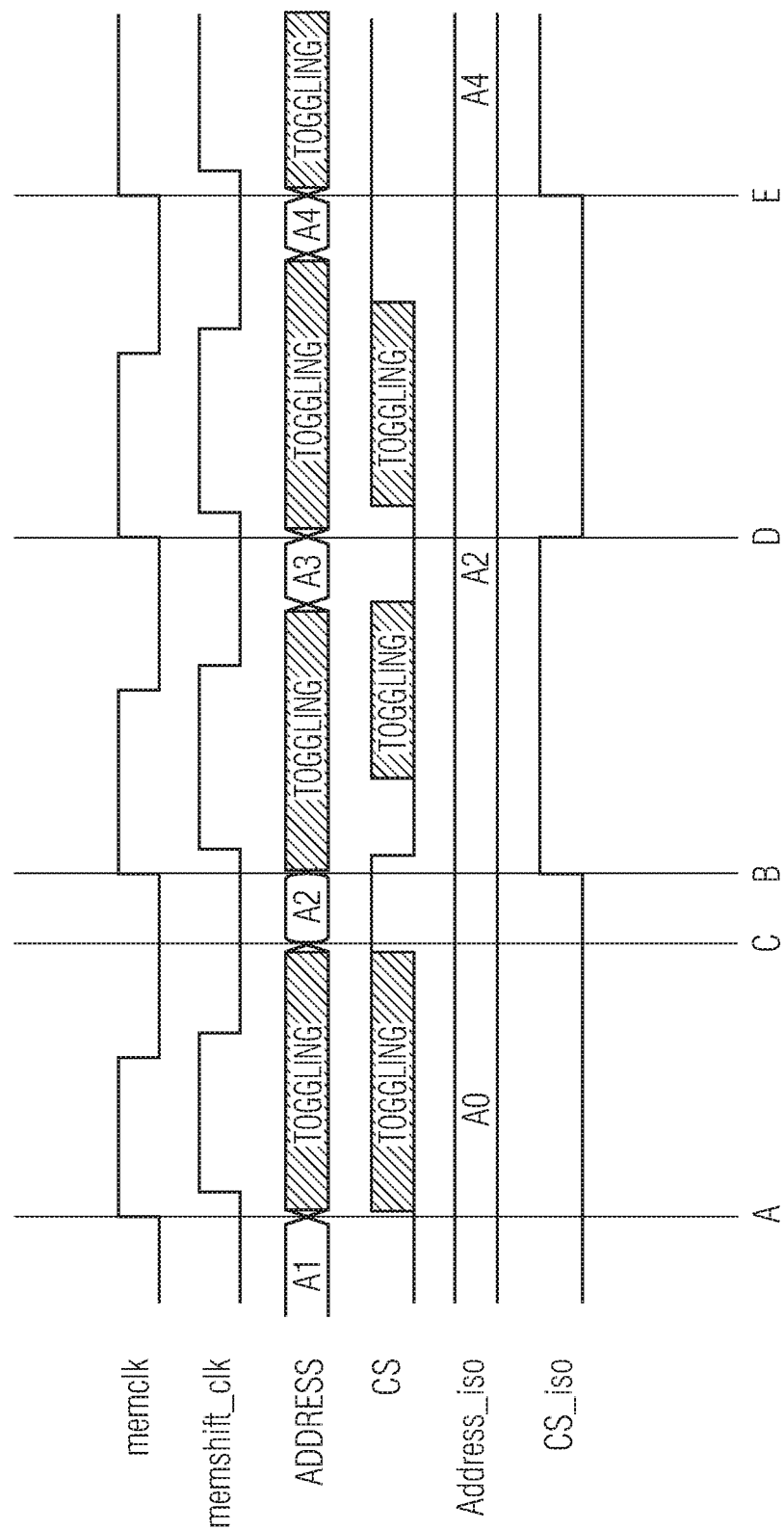
FIG. 4 is a timing diagram of signals in the isolation stage.

FIG. 4 is a timing diagram of some of the signals in the isolation stage of FIGS. 2 and 3 with amplitude on the vertical axis and time on the horizontal axis. The vertical axis indicates three possible states for the digital signal, first a low, OFF or 0 state, second a high, ON or 1 state, and third toggling. The top signal, memclk, is the normal clock signal 211 output by the clock generator 210. The second signal, memshift_clk, is the phase-shifted clock signal 212 of the clock generator. The memclk signal completes one full clock cycle in the time between A and B on the time axis. The memclk signal completes another full clock cycle in the time between B and D and again between D and E. The phase-shifted clock has a clock cycle with the same duration but delayed less than one half clock cycle. The Address and CS signals are generated by the memory controller which uses the same memclk signal and therefore the Address and CS signals are synchronized with memclk.

The address and CS signals are toggling at time A. To access the memory, the memory controller sets the CS line to high at time C before the memclk pulse hits the memory at time B. The memory controller also sets an address labeled as A2 at time C. In normal operation, at time B the memory would receive the next clock cycle see the Address and CS lines and perform a read or write to address A2.

With the isolation stage, when a memclk pulse hits the isolation stage then the pulse is also applied to the clock input of the CS flip-flop of the isolation stage. The Q output signal of that flip-flop is labeled CS_iso. While the CS line goes high at the D input at time C, the Q output, CS_iso, does not change until the clock pulse at time B. In addition, CS_iso stays high until the next clock cycle at time D when CS is low. On the other hand, the CS line from the memory controller toggles after the initial pulse in the time of the clock cycle between time B and D.

Similarly, Address goes to A2, at time C before the start of the next clock cycle of mem_clk at time B. After time B and before the end of the next clock cycle at time D, the address line might toggle. Address_iso represents the Q output signal of the address line from the isolation stage. Going back to the start of the second indicated clock cycle at time B, Addresss_iso goes to A2 and stays at A2 until there is a change and the CS line is also high. In the illustrated example, CS is low during the clock cycle from time D to E. At time E CS is high. Address_iso stays set to A2 as long as CS is low even though the Address line goes to A3. At time E CS is high and the Address line is set to A4. Accordingly, Address_iso goes to A4. Addresss_iso never goes to A3. However, since CS is low during A3, A3 is not intended for the connected memory. It may be for a different memory or some sort of toggle or floating value. The timing diagram shows how toggling is isolated from the memory and how the outputs of the isolation stage change only when a clock signal is applied to the respective component of the isolation stage to permit a change of state.

Figure 5:
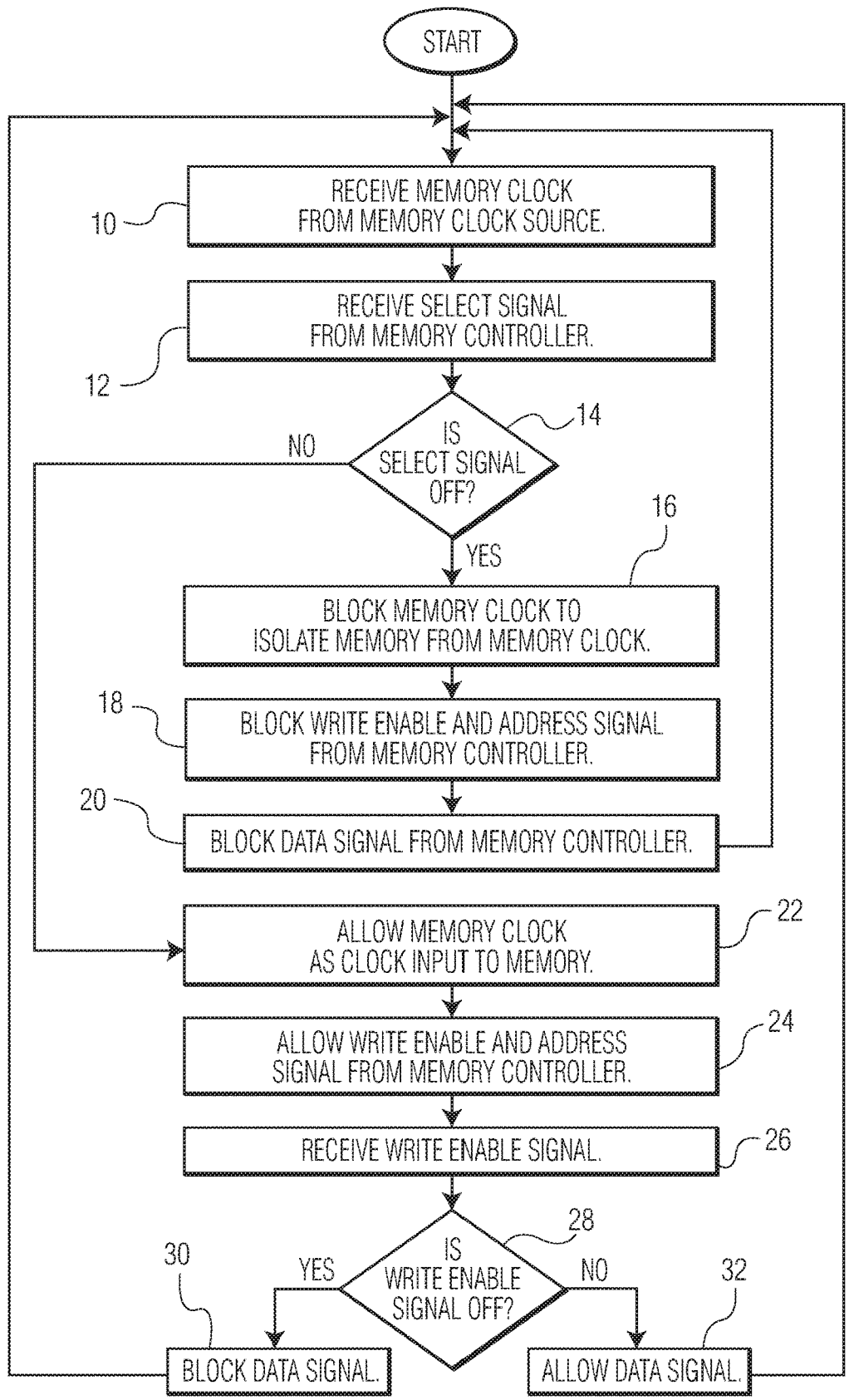
FIG. 5 is a process flow diagram of operating the memory controller using the isolation stage.

FIG. 5 is a process flow diagram of operating the memory controller using the isolation stage as described above. At 10 a memory clock is received at a gate from a memory clock source. The gate is coupled between the memory clock source and a memory. At 12 a select signal is received from a memory controller at a trigger of the gate. The memory controller is coupled to the memory. The select signal indicates that the coupled memory is to be accessed, e.g. for a read or a write operation. At 14, a gate is used to determine whether the select signal is OFF or ON. If the select signal is OFF then at 16, the memory clock is blocked at the gate to isolate the memory from the memory clock source.

At 18 the memory controller generates a write enable and an address signal to the memory and if the select signal is OFF, then the write enable and the address signal are blocked using the second gate in response to the OFF state of the select signal. As described above, the second gate controls the clock signal to flip-flops between the write enable and the address line memory controller outputs and the memory. These signals may alternatively be blocked in a different way. At 20 the memory controller generates a data signal to the memory. The select signal and the write enable signal are received at a third gate which blocks the data signal using the third gate in response to an OFF state of the select signal. Similarly, the data signal is blocked by a flip flop between the data signal to the memory controller and the memory input. The third gate controls the clock input to the flip-flop. The process then returns to 10.

If the select signal is ON, then at 22 the memory clock is allowed to connect to the memory. As described above, this memory clock may be phase-shifted with a short delay of less than one half clock cycle. At 24 the write enable and address signal are allowed from the memory controller using the second gate to control a flip-flop clock inputs. As described above, these signals may be applied through a flip-flop or other digital gate or processor to hold the state of the signals for a full clock cycle and prevent toggling.

At 26 the write enable signal is received at a third gate. If the write enable is OFF, indicating that the operation is a read and not a write, then at 30 the data signal from the memory controller is blocked at the third gate and the process returns to 10. If on the other hand, the write enable is ON indicating that the operation is a write, then the data signal is allowed using the third gate at 32 and the process returns to 10.

Figure 6:
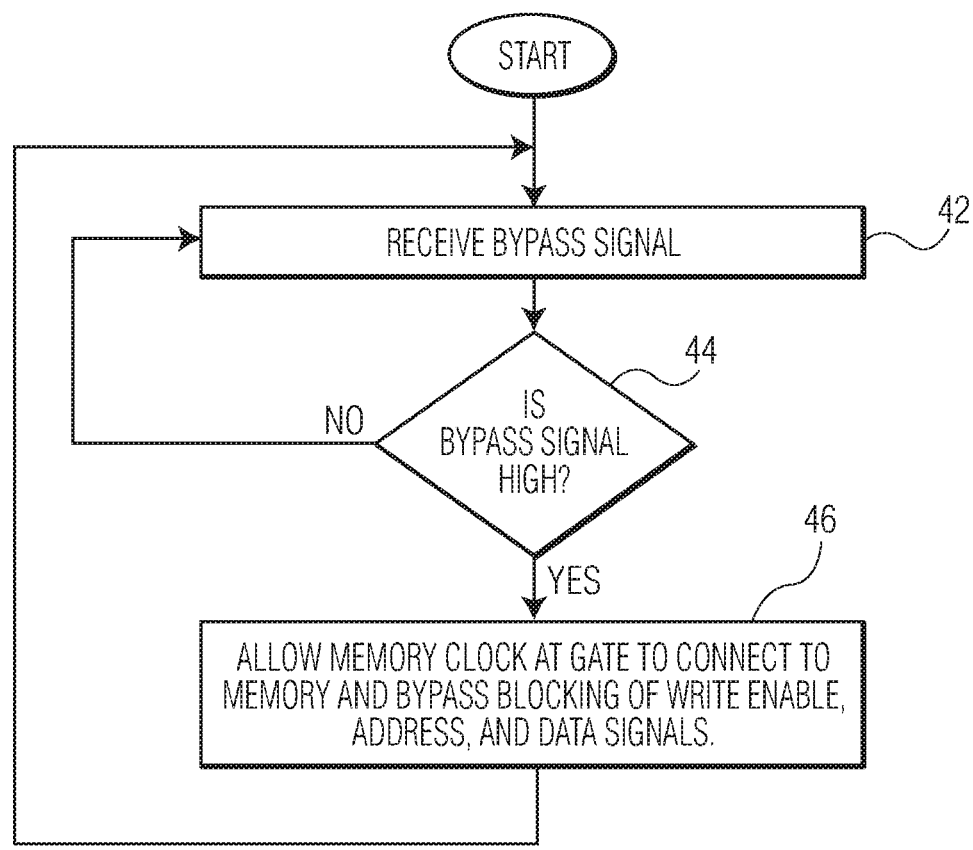
FIG. 6 is a process flow diagram of operating the bypass structure.

FIG. 6 is a process flow diagram of a process that runs parallel to the process described above with respect to FIG. 5. At 42 a bypass signal is received at one or more bypass gates. These are illustrated above as multiplexers with a select signal but the bypass structures may take different forms to suit different implementations. At 44 if the bypass signal is high or on indicating a bypass, then at 46 the memory clock gate is opened to allow the clock signal to reach the memory and all of the flip-flops are bypassed so that the memory controller's write enable, address and data signals are connected to the memory. The process returns to 42.

If the bypass signal is low, then nothing is bypassed and the process returns to 42. This process runs in parallel so that the system is ready to block signals as in FIG. 5, whenever bypass is disabled, but can immediately bypass the blocking when bypass is enabled.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A memory isolation device, comprising:
   wherein the memory isolation device is configured to be coupled to a memory having a register accessible using an address;
   wherein the memory isolation device is configured to be coupled to a memory controller;
   wherein the memory controller is configured to control read and write operations to the memory;
   wherein a bus is configured to communicate data and commands to each of the memory controller;
   wherein a processing core is coupled to the bus and configured to read and write data to the memory through the memory controller; and
   wherein the memory isolation device includes an isolation stage;
   wherein the isolation stage is coupled between the memory controller and the memory and is configured to isolate the memory from receiving a memory clock signal when the memory is not addressed by the memory controller.

2. The device of claim 1,
   wherein the memory controller is configured to provide a memory select signal when the memory is addressed and wherein the isolation stage passes the memory clock signal in response to the memory select signal.

3. The device of claim 2,
wherein the isolation stage includes a gate between a memory clock source and a memory clock input of the memory, the gate having a toggle input coupled to receive the memory select signal from the memory controller.

4. The device of claim 3,
wherein the gate includes a flip-flop with a toggle input.

5. The device of claim 3,
wherein the gate is configured to output the clock signal to the memory with a delay in response to receiving the memory select signal, and
wherein the delay is less than one half clock cycle of the memory clock source.

6. The device of claim 1,
wherein the memory is configured to respond to an address line upon receiving a delayed clock signal within a same clock cycle as the memory clock signal.

7. The device of claim 3, further comprising
a flip-flop coupled between the memory controller and the gate,
wherein the flip-flop is coupled to receive the memory select signal and includes a select output and
wherein the flip-flop is coupled to the memory clock source so that the select output changes on each clock cycle of the memory clock signal.

8. The device of claim 1,
wherein the memory is configured to receive a data line, an address line and a write enable line; and
wherein the isolation stage is configured to isolate the memory from at least one of the data line, the address line, and the write enable line when the memory is not addressed by the memory controller.

9. The device of claim 8,
wherein the memory controller is configured to provide a memory select signal when the respective coupled memory is addressed and wherein the isolation stage isolates the memory from the data, address, and write enable lines of the memory controller when no memory select signal is provided.

10. The device of claim 8,
wherein the memory controller is configured to provide a write enable signal on the write enable line to write data on data lines to the memory and wherein the isolation stage is further configured to isolate the memory from the data lines when no write enable signal is provided.

11. The device of claim 10,
wherein the memory controller is configured to provide a zero output on the data lines when there is no data present at the memory controller to write to the memory and wherein the isolation stage isolates the memory from the zero output.

12. The device of claim 1,
wherein the memory is configured to receive a data line, an address line and a write enable line from the isolation stage; and
wherein the device further comprises a bypass structure configured to bypass the isolation stage and pass at least one of the data line, the address line and the write enable line from the memory controller to the memory in response to receiving a bypass signal.

13. The device of claim 1,
wherein the bus has a mesh configuration.

14. A method for operating a memory system comprising:
receiving a memory clock at a gate from a memory clock source, wherein the gate is coupled between the memory clock source and a memory;
receiving a memory select signal from a memory controller at a trigger of the gate, wherein the memory controller is coupled to the memory;
blocking the memory clock at the gate to isolate the memory from the memory clock source in response to an OFF state of the memory select signal;
wherein the memory controller generates a data signal, a write enable signal and an address signal to be transmitted to the memory; and
isolating the memory from the data signal, the address signal, and the write enable signal when the memory is not addressed by the memory controller.

15. The method of claim 14,
further comprising receiving the memory select signal at a second gate and blocking the write enable signal and the address signal through the second gate in response to an OFF state of the memory select signal.

16. The method of claim 15,
further comprising receiving the memory select signal and the write enable signal at a third gate and blocking the data signal through the third gate in response to an OFF state of the memory select signal and of the write enable signal.

17. The method of claim 14, further comprising
receiving an external bypass signal and allowing the memory clock at the gate to connect to the memory.

18. A memory device comprising:
a plurality of memories each having registers that are accessible using an address;
a plurality of memory controllers each coupled to a memory and configured to control read and write operations to the respective coupled memory;
a memory mesh coupled to each of the memory controllers and configured to communicate data and commands to each of the memory controllers;
a plurality of processing cores coupled to the memory mesh and configured to read and write data to the memories through the memory controllers;
a plurality of memory clock gates, each coupled between a memory clock source and a memory clock input of a respective memory, each gate having a toggle input coupled to receive a memory select signal from the respective memory controller configured to alternately connect and disconnect the memory clock source from the memory clock input in response to the respective memory select signal; and
a plurality of data gates coupled between a data output of each memory controller and a respective data input of a respective memory each data gate having a toggle coupled to receive the memory select signal and to a write enable output of the respective memory controller configured to alternately isolate and connect the respective memory controller data output and the memory data input.

19. The memory device of claim 18,
wherein at least one processing core comprises a direct memory access module.

* * * * *